US010056236B2

(12) United States Patent
Watanabe et al.

(10) Patent No.: US 10,056,236 B2
(45) Date of Patent: Aug. 21, 2018

(54) PLASMA PROCESSING METHOD

(71) Applicant: HITACHI HIGH-TECHNOLOGIES CORPORATION, Minato-ku, Tokyo (JP)

(72) Inventors: Hayato Watanabe, Tokyo (JP); Masahito Mori, Tokyo (JP); Takao Arase, Tokyo (JP); Taku Iwase, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/443,488

(22) Filed: Feb. 27, 2017

(65) Prior Publication Data
US 2018/0082825 A1    Mar. 22, 2018

(30) Foreign Application Priority Data
Sep. 21, 2016  (JP) .................................. 2016-183621

(51) Int. Cl.
| | |
|---|---|
| H01L 21/3065 | (2006.01) |
| H01L 21/67 | (2006.01) |
| B08B 7/00 | (2006.01) |
| H01J 37/32 | (2006.01) |
| B08B 9/46 | (2006.01) |

(52) U.S. Cl.
CPC ...... H01J 37/32853 (2013.01); B08B 7/0035 (2013.01); B08B 9/46 (2013.01); H01J 37/32009 (2013.01); H01J 37/3244 (2013.01); H01L 21/3065 (2013.01); H01L 21/67069 (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,886,573 B2 * | 5/2005 | Hobbs | ................... B08B 7/0035 134/1.1 |
| 7,028,696 B2 | 4/2006 | Richardson et al. | |
| 8,557,709 B2 | 10/2013 | Sumiya et al. | |
| 2003/0000546 A1 * | 1/2003 | Richardson | ............... B08B 3/06 134/1.1 |
| 2004/0045576 A1 | 3/2004 | Hobbs et al. | |
| 2004/0103914 A1 | 6/2004 | Cheng et al. | |

(Continued)

FOREIGN PATENT DOCUMENTS

| | | |
|---|---|---|
| JP | 2011-192872 A | 9/2011 |
| JP | 2015-032780 A | 2/2015 |

(Continued)

OTHER PUBLICATIONS

Office Action dated Dec. 12, 2017 for related Taiwan Patent Application No. 106102449.

*Primary Examiner* — Shamim Ahmed
(74) *Attorney, Agent, or Firm* — Miles & Stockbridge P.C.

(57) ABSTRACT

A plasma processing method for plasma-etching a sample in a metallic processing chamber includes etching the sample with a plasma; plasma-cleaning the processing chamber with a fluorine-containing gas after etching the sample; and plasma-processing the processing chamber with a gas containing sulfur and oxygen after plasma cleaning the processing chamber.

5 Claims, 5 Drawing Sheets

(56) References Cited

U.S. PATENT DOCUMENTS

| | | | |
|---|---|---|---|
| 2004/0127033 A1* | 7/2004 | Takatsuki | H01J 37/32009 438/689 |
| 2006/0027249 A1* | 2/2006 | Johnson | C23C 16/4405 134/1.1 |
| 2006/0130873 A1 | 6/2006 | Richardson et al. | |
| 2009/0047447 A1* | 2/2009 | Sawin | B08B 7/0035 427/575 |
| 2012/0091095 A1* | 4/2012 | Wang | H01J 37/3244 216/37 |
| 2015/0294843 A1* | 10/2015 | Chen | H01J 37/32862 438/710 |

FOREIGN PATENT DOCUMENTS

| | | |
|---|---|---|
| TW | 546707 A | 8/2003 |
| TW | 200410337 A | 6/2004 |
| TW | 201143555 A | 12/2011 |
| TW | 201222662 A | 6/2012 |

\* cited by examiner

PLASMA PROCESSING METHOD

BACKGROUND OF THE INVENTION

1. Field of the Invention

The present invention relates to processing performed by a semiconductor fabrication apparatus. In particular, the invention relates to a plasma processing method for plasma etching.

2. Description of the Related Art

Performing plasma etching on polysilicon films that are used as a gate electrode material for metal-oxide-semiconductor (MOS) transistors, and $SiO_2$, SiON, or carbon-based films used as a hardmask to pattern polysilicon films causes carbon- or silicon-based reaction products to accumulate in vacuum vessels (processing chambers). This accumulation results in time-varying changes in etching performance.

Plasma cleaning is generally used to prevent these time-varying changes. This procedure employs plasma of a gas mixture containing $SF_6$, $NF_3$, $CF_4$, or other fluoride gases, as well as oxygen to remove accumulated reaction products. Wafer-less cleaning is a generally adopted technique in which no dummy wafer is placed on the wafer stage during plasma cleaning. Since no wafer is placed on the electrode for wafer placement at the time of performing this wafer-less cleaning, the surface of the electrode for wafer placement can be worn by plasma irradiation. This wear can cause a metallic element that constitutes the wafer placement surface to diffuse inside the chamber, bringing about metallic contamination.

If the surface of the electrode for wafer placement is primarily composed of alumina ($Al_2O_3$) for example, wear in the electrode surface may cause contamination with aluminum.

To resolve this problem, Japanese Unexamined Patent Application Publication No. 2015-32780 discloses a technology for reducing the amount of metallic contamination resulting from workpiece etching processing. According to the technology, a plasma processing apparatus includes a stage electrode for workpiece placement. The workpiece-placement surface of the stage electrode is primarily made from $Al_2O_3$. The plasma processing apparatus adopts an etching processing method that uses $BCl_3$ gas for workpiece etching. The apparatus further includes cleaning discharge means by which at least two cleaning discharges are performed between predetermined plasma processing of an Nth workpiece and the predetermined plasma processing of an N+1th workpiece. The two cleaning discharges are made up of a first cleaning discharge that discharges an $O_2$ cleaning gas to react with boron, a metallic element contained in the etching gas, so as to selectively remove chlorine from a volatile deposit of a B—Cl reaction product; and a second cleaning discharge that discharges a $SF_6$ or CxFy cleaning gas to remove reductive boron.

Japanese Unexamined Patent Application Publication No. 2011-192872 discloses a technology for preventing fluctuations in the performance of plasma etching on metal-containing wafers. This technology enables plasma etching to be performed on a wafer after coating processing. The plasma etching involves metal cleaning and plasma cleaning by the use of a fluorine-containing gas.

SUMMARY OF THE INVENTION

In recent years, deep-cavity and deep-trench etching techniques used in the development of 3D NAND flash and other three-dimensional devices have increased the time taken for plasma processing of production wafers. This has increased the amount of deposits formed on processing chambers or wafer stages and thus increased the time taken for the process of cleaning these processing chambers. In line with this longer process time, part of an alumina surface, an anodized aluminum surface or any other metal surface from which deposits have been removed is exposed to plasma for longer time. This results in the reaction of fluorine and the metal surface to form AlFx or any other new metallic compound. Unfortunately, this metallic compound generation leads to the deposition of AlF or other foreign matter at the time of plasma processing of a next production wafer, and thereby decreases yield and degrades device characteristics.

The method disclosed in Japanese Unexamined Patent Application Publication No. 2015-32780 does not satisfactory address the need for removing AlFx or other metallic compounds formed by implementation of long-time cleaning as described above.

In like manner with Japanese Unexamined Patent Application Publication No. 2015-32780, the method disclosed in Japanese Unexamined Patent Application Publication No. 2011-192872, which includes a coating step, does not satisfactory address the need for removing AlFx or other metallic compounds formed by implementation of long-time cleaning.

The present invention, accomplished to solve the problems described above, provides a plasma processing method that prevents the occurrence of a metallic compound in processing a series of production wafers.

According to an aspect of the present invention, a plasma processing method for plasma-etching a sample in a metallic processing chamber includes etching the sample with a plasma; plasma-cleaning the processing chamber with a fluorine-containing gas after etching the sample; and plasma-processing the processing chamber with a gas containing sulfur and oxygen after plasma-cleaning the processing chamber.

The present invention provides a plasma processing method that prevents the occurrence of a metallic compound in processing a series of production wafers.

DESCRIPTION OF THE PREFERRED EMBODIMENT

A plasma etching apparatus, i.e. a plasma processing apparatus used for plasma processing according to an embodiment of the present invention, will now be described.

Figure 1:
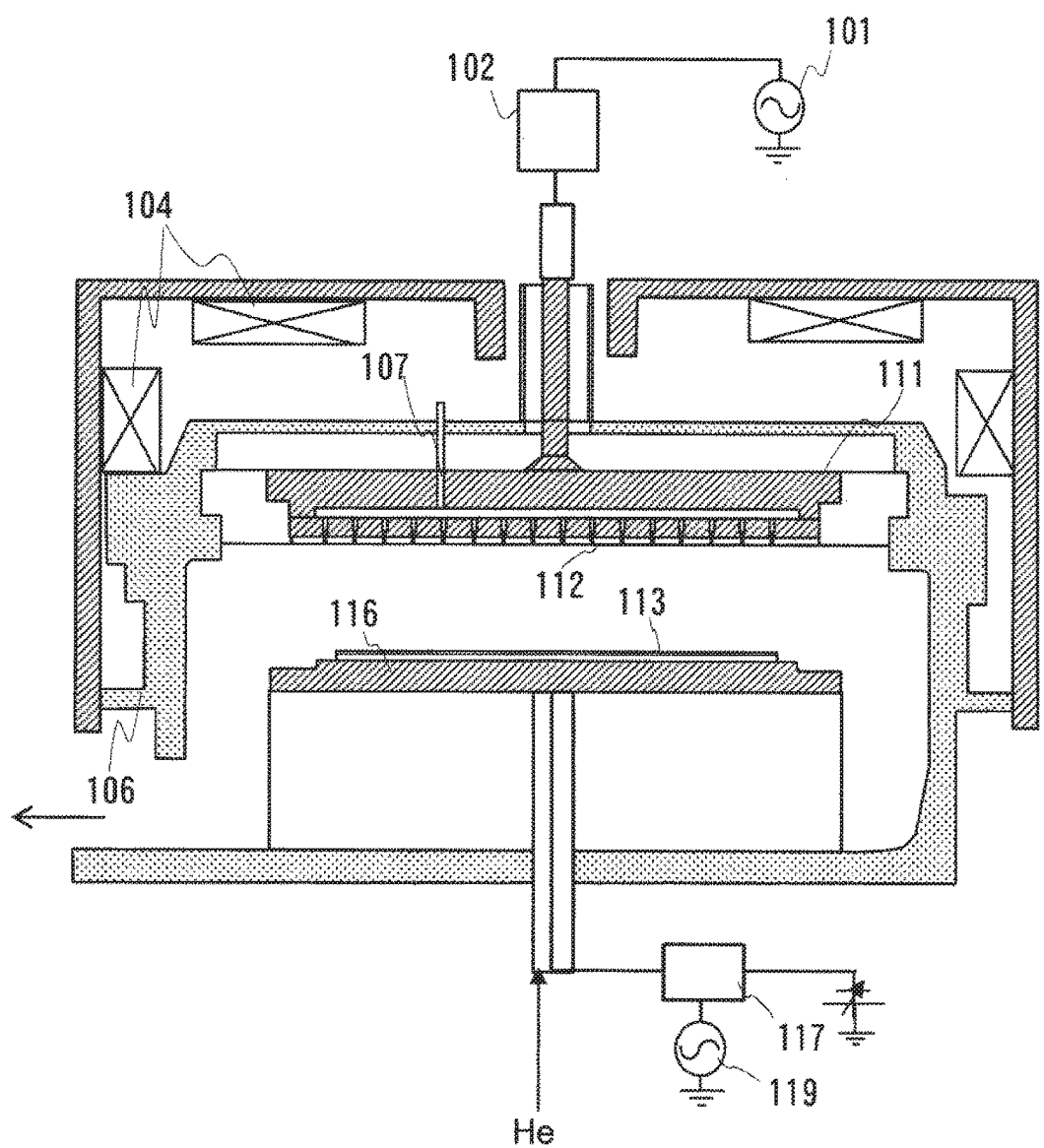
FIG. 1 is a longitudinal sectional view of a plasma processing apparatus used in a plasma processing method according to an embodiment of the present invention.

FIG. 1 is a longitudinal sectional view of a parallel-plate type etching apparatus with an effective magnetic field very high frequency (VHF) plasma source. This plasma etching apparatus includes a processing chamber 106, a VHF transmitting antenna 111, a vacuum pump (not shown), and a pressure control valve (not shown). The processing chamber 106 is made from aluminum, stainless steel, or any other metal. A surface of an inner wall of the processing chamber 106 is formed from a film including quartz and yttria, as well as a coating of anodized aluminum.

An etching gas passes through a gas inlet 107 by way of a mass flow controller and a stop valve (both not shown) such that the gas is introduced into the processing chamber 106 via a plurality of concentrically formed holes in a shower plate 112. The gas is discharged from an exhaust port (not shown) provided at a lower part of the processing chamber 106 by the use of a turbo pump and a dry pump (both not shown). The etching gas introduced in this way is dissociated by electromagnetic energy so as to generate and maintain plasma. The electromagnetic energy is applied by plasma generation means.

The plasma generation means includes a radio frequency power source 101 for generation of 200 MHz VHF wave plasma, a first matching device 102, and magnetic field generation means made up of electromagnets 104. A wafer stage 116 that acts as a sample stage for placing a wafer 113, i.e. a sample, can control a plurality of portions of the wafer stage 116 to predetermined different temperatures using a plurality of temperature control means (not shown) or other means.

The plasma etching apparatus adopts an electrostatic chuck method for clamping wafers through static electricity to improve thermal contact between the wafer 113 and the wafer stage 116. A wafer-placement surface of the wafer stage 116 includes a ceramic film made primarily from $Al_2O_3$ (alumina).

The wafer stage 116 is connected to a 4 MHz RF bias power source 119 that brings ions from plasma into the wafer 113 and controls energy of these ions, as well as to a second matching device 117. A plasma processing method according to the embodiment of the present invention will now be described with reference to FIG. 2.

Figure 2:
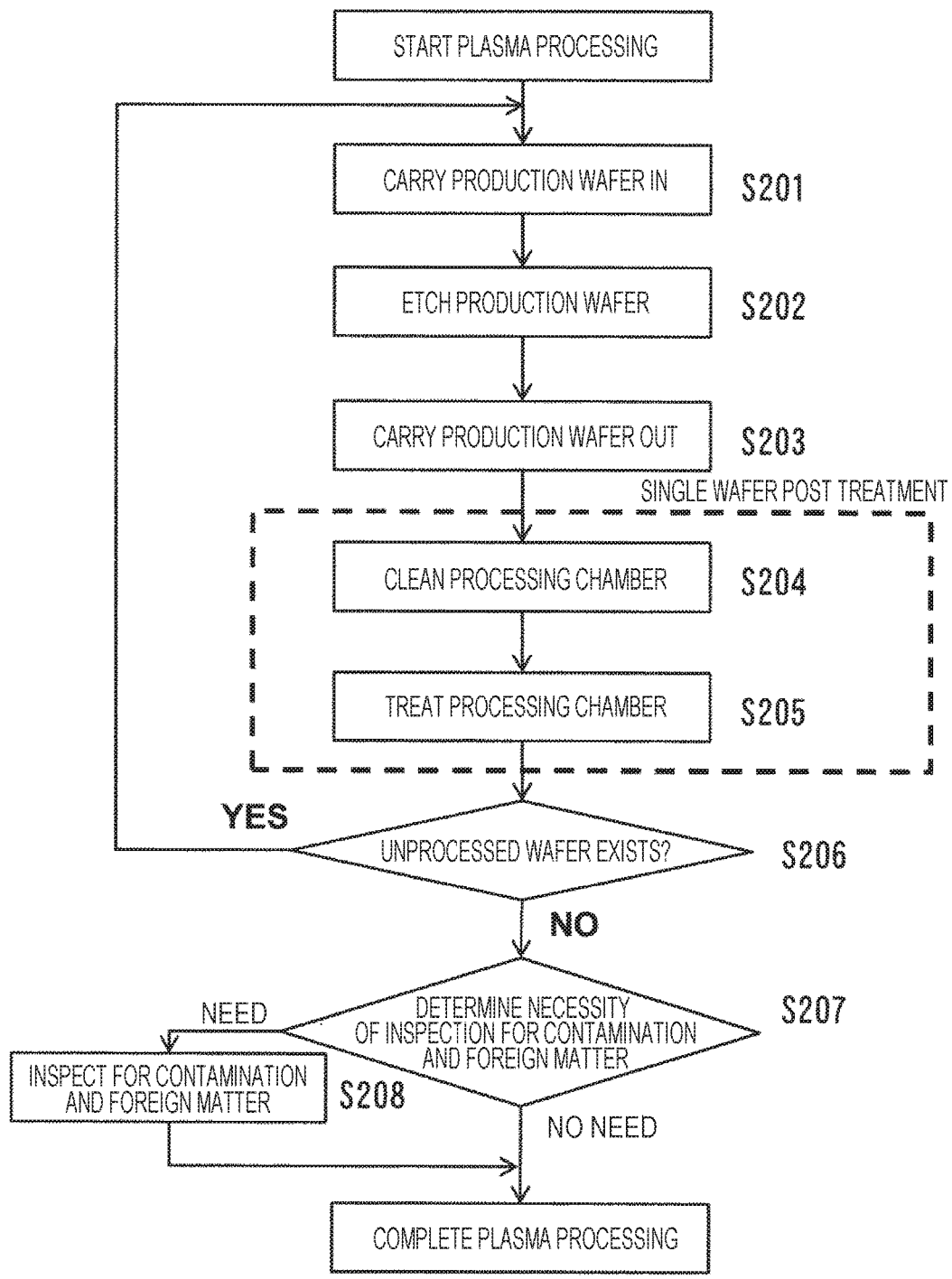
FIG. 2 is a flowchart illustrating the plasma processing method according to the embodiment of the present invention.

FIG. 2 is a flowchart illustrating the plasma processing method according to the embodiment of the present invention. In line with the start of plasma processing, the plasma etching apparatus carries a production wafer into the processing chamber 106 using transportation means (not shown) and places the wafer on the wafer stage 116 in Step S201. In Step S202, the apparatus etches the production wafer on the wafer stage 116 with plasma under predetermined plasma processing conditions. The plasma processing conditions predetermined in this embodiment are plasma processing conditions for three-dimensional memory fabrication. In Step S203, the apparatus carries the plasma etched production wafer out of the processing chamber 106 using the transportation means (not shown).

In Step S204, the interior of the processing chamber 106 is cleaned with plasma while the wafer-placement surface of the wafer stage 116 is exposed (no wafer is placed on the wafer stage 116). A gas appropriate for this plasma cleaning is selected depending on the composition of a deposit formed in the processing chamber 106 and the volatility of a product of reaction with the deposit. If the deposit is primarily formed from silicon for example, the cleaning process uses a fluoride gas such as $SF_6$, $NF_3$, $CF_4$, and $CHF_3$, a mixture of the fluoride gas and $O_2$, or a mixture of the fluoride gas and $N_2$ such that a product of reaction between the deposit and the gas exhibits high volatility.

If the deposit is primarily formed from carbon, a mixture of $O_2$ or $N_2$ and a fluorine-containing gas is used. If the deposit is primarily formed from metal, the cleaning process uses $Cl_2$ gas or a mixture of $Cl_2$ and $BCl_3$.

Plasma cleaning conducted in Step S204 according to this embodiment may be intended for at least any of a deposit formed primarily from silicon, a deposit formed primarily from carbon, and a deposit formed primarily from metal. The cleaning process in this embodiment, however, uses plasma of a mixture of $O_2$ and $SF_6$ gases to remove a carbon-based deposit and uses plasma of a mixture of $SF_6$ and Ar gases to remove a silicon-based deposit.

This plasma cleaning performed in Step S204 can remove a reaction product deposited on an inner surface of the processing chamber 106 and a silicon or carbon containing deposit caused by a deposition gas during etching processing of a production wafer in Step S202. This removal allows stabilization of etching performance.

If the plasma etching apparatus needs to remove a Ti, Ta, Hf, or other metals-containing deposit that is formed on parts like the processing chamber 106 after processing of a production wafer having a metal gate structure, another process for making a silicon dioxide-based coating deposited on the inner surface of the processing chamber 106 by the use of $SiCl_4$ gas can be added to the end of Step S204. This additional process reduces contamination of the production wafer with a metal originating from an element of the processing chamber 106 or the wafer stage 116 surface (alumina).

In Step S205, the apparatus performs a treatment process in which the interior of the processing chamber 106 is processed with plasma composed of COS gas, $SO_2$ gas, or another gas containing sulfur and oxygen. Because of a reason described later, this plasma process using COS gas, $SO_2$ gas, or another gas containing sulfur and oxygen is capable of removing AlFx or other metallic compounds deposited inside the processing chamber 106. In this embodiment, the process uses a mixture of COS and $O_2$ gases. With reference to FIG. 2, a process that combines plasma cleaning in Step S204 and the treatment process in Step S205 is called "single wafer post treatment" hereafter.

In Step S206, the apparatus determines the presence or absence of an unprocessed production wafer. If an unprocessed production wafer exists, the apparatus goes through Steps S201 to S206 in sequence. If no unprocessed production wafer exists, the apparatus goes to Step S207. In Step S207, the apparatus determines whether or not to perform an inspection for contamination and foreign matter according to a predetermined criterion. The apparatus performs an inspection for contamination and foreign matter in Step S208 if it has determined to perform an inspection for contamination and foreign matter. The apparatus completes this plasma processing if it has determined not to perform an inspection for contamination and foreign matter. In this embodiment, an inspection for contamination and foreign matter in Step S208 involves placing a wafer on the wafer stage 116 and conducting plasma processing with argon gas for 10 seconds so as to measure the amount of metallic contamination.

Figure 3:
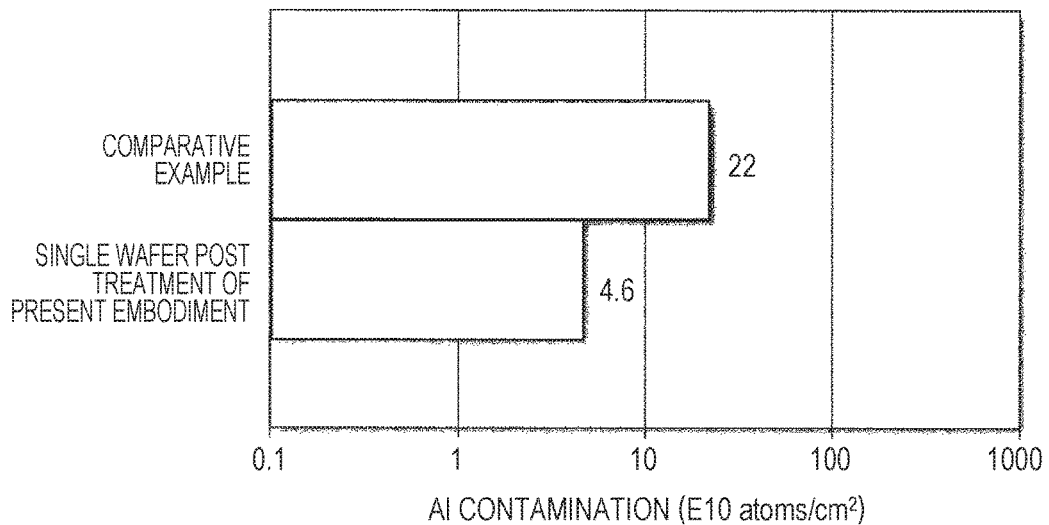
FIG. 3 illustrates a comparison of aluminum contamination amounts.

FIG. 3 illustrates experimental results of aluminum contamination amounts compared between the plasma processing method according to this embodiment and another plasma processing method taken as a comparative example. The plasma processing method taken as the comparative example goes through Steps S201 to S204 shown in the plasma processing method flowchart of FIG. 2 and performs plasma processing only with $O_2$ gas after plasma cleaning in Step S204.

As shown in FIG. 3, the treatment process performed in Step S205 of this embodiment lowered the aluminum contamination amount from 22.0 E10 atoms/cm$^2$ to 4.6 E10 atoms/cm$^2$. Table 1 shows experimental results of comparisons of the amounts of contamination by metals other than aluminum between the plasma processing method of this embodiment and a conventional plasma processing method. As shown in Table 1, the plasma processing method according to this embodiment yielded the results of smaller amounts than the conventional plasma processing method in contamination by Mg, Mn, Fe, Ni, and Cu metals as well.

TABLE 1

|  | Mg | Mn | Fe | Ni | Cu |
| --- | --- | --- | --- | --- | --- |
| Comparative example | 2.4 | 0.24 | 0.36 | 0.11 | 0.2 |
| Single wafer post treatment of this embodiment | 0.12 | 0.013 | 0.018 | 0.027 | 0.014 |

Unit: E10 atoms/cm$^2$

Figure 4:
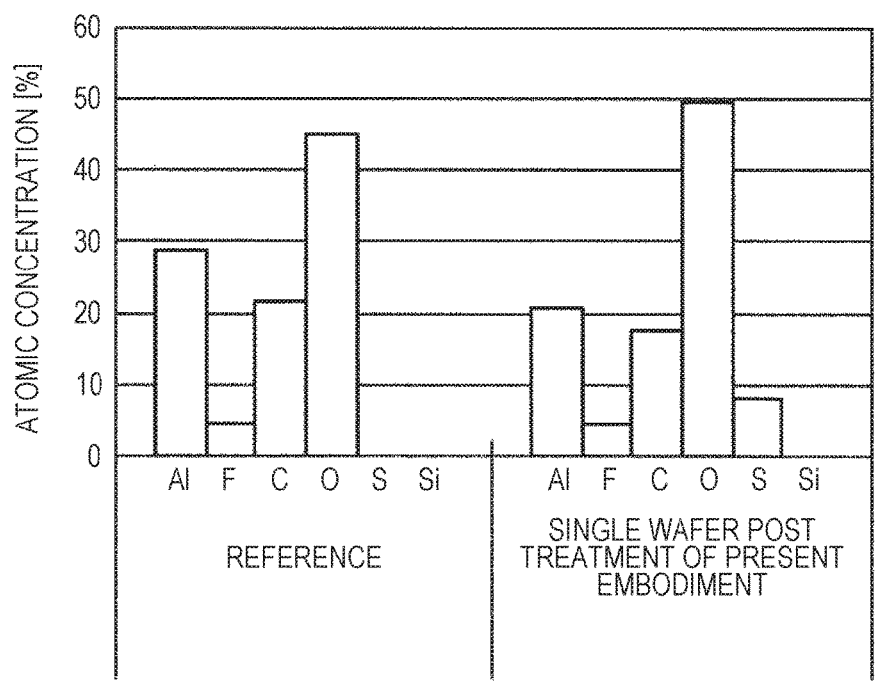
FIG. 4 illustrates results of XPS analyzed $Al_2O_3$ substrate surfaces.

FIG. 4 illustrates results of composition of a plasma processed wafer with an attached small $Al_2O_3$ piece and a non-plasma processed wafer (reference) with an attached small $Al_2O_3$ piece, which were measured by an X-ray photoelectron spectroscopy (XPS) analyzer. The plasma processed wafer with the attached piece underwent plasma cleaning with $SF_6$ gas and treatment with a mixture of COS and $O_2$ gases. The small $Al_2O_3$ pieces were used in place of AlFx and other metallic compounds.

Figure 5:
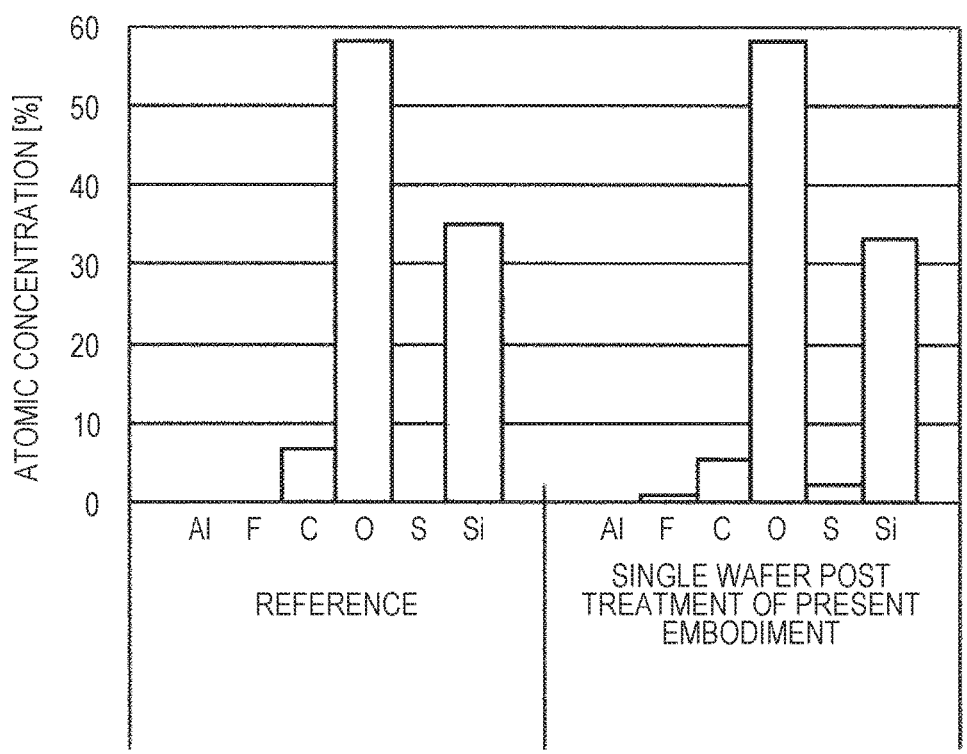
FIG. 5 illustrates results of XPS analyzed SiO substrate surfaces.

FIG. 5 illustrates results of composition of a plasma processed wafer with an attached small $SiO_2$ piece and a non-plasma processed wafer (reference) with an attached small $SiO_2$ piece, which were measured by an XPS analyzer. The plasma processed wafer with the attached piece underwent plasma cleaning with $SF_6$ gas and treatment with a mixture of COS and $O_2$ gases.

The results of FIG. 4 indicate that sulfur and oxygen components have deposited on the $Al_2O_3$ piece, leading to a decrease in the aluminum component. Meanwhile, the results of FIG. 5 indicate that sulfur and oxygen have hardly deposited on the surface of the $SiO_2$ piece. These results illustrate that sulfur and oxygen have selectively deposited on the surface of the $Al_2O_3$ piece and that the aluminum surface has been sulfurized to $SO_3$ or $SO_4^2$, as well as $Al_2(SO_4)_3$ or any other similar compound, resulting in surface modification of the aluminum piece. Since AlFx and similar metallic compounds are presumed to display a tendency similar to that of aluminum, AlFx and similar metallic compounds are presumed to produce results similar to those in FIGS. 4 and 5.

Consequently, since the plasma processing method according to this embodiment includes the treatment process (Step S205) for plasma processing of a processing chamber with a gas containing sulfur and oxygen, performing this plasma processing on the processing chamber of a plasma etching apparatus causes the surface of aluminum that is deposited on a side wall of the chamber or exposed at the chamber surface to be sulfurized to SOx and thereby prevents the chemical element from redepositing on wafers. This mechanism can reduce the amount of contamination with aluminum. This reduction in aluminum contamination amount lessens foreign matter arising from AlF and reduces the deterioration of device performance.

Even if three-dimensional memory production or other fabrication requires longer time for single wafer cleaning after plasma processing, plasma processing according to this embodiment described above can prevent the generation of foreign matter and reduce contamination by metal (aluminum in particular) inside vacuum vessels. This prevents yield reduction and device performance deterioration.

Figure 6:
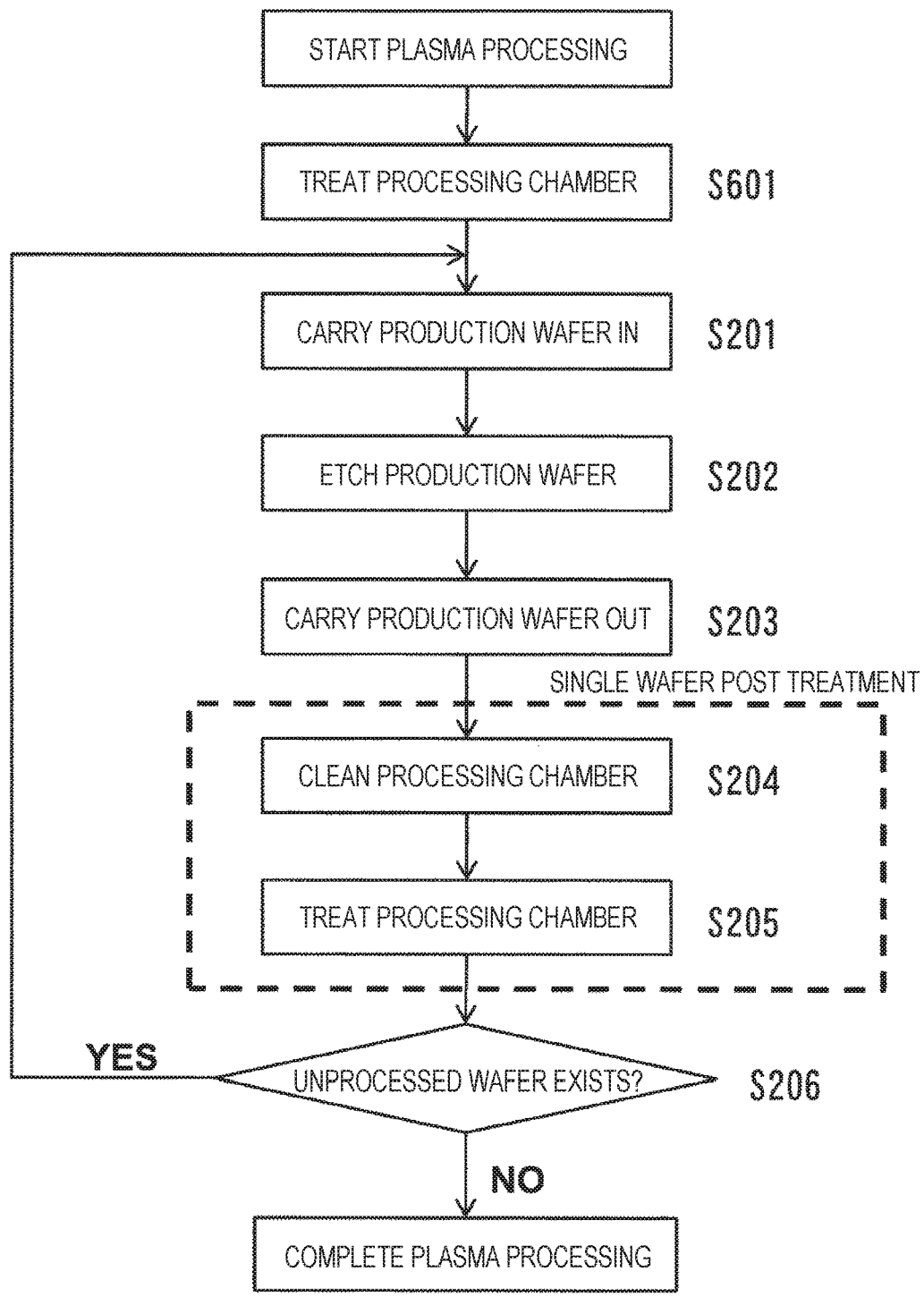
FIG. 6 is another flowchart illustrating a plasma processing method according to the embodiment of the present invention.

In the plasma processing method according to this embodiment, a treatment process (Step S205) may be added before the step for carrying a production wafer into a processing chamber. Specifically, with reference to FIG. 6, a plasma etching apparatus goes through Step S601 for a treatment process before Step S201 for carrying a production wafer into a processing chamber 106. Among steps of a flowchart shown in FIG. 6, the steps identical to those of the flowchart in FIG. 2 are assigned with the same reference numerals, and their redundant descriptions are omitted. The treatment process in Step S601 of FIG. 6 is identical to that in Step S205 of FIG. 6. Plasma processing shown in FIG. 6 allows a first wafer of a set of production wafers that differ from a previously-processed wafer in terms of film structure or opening area to undergo reduced metallic contamination and lessened foreign matter in the identical processing chamber 106, similarly with a second and subsequent wafers of the set of the production wafers, without being influenced by the processing history.

In this embodiment described above, the apparatus goes through Step S204 while no wafer is placed on the wafer stage 116. However, an apparatus can achieve effects similar to those in this embodiment even if a wafer is placed on a wafer stage 116. This is because the present invention deals with aluminum of AlFx and other metallic compounds, which includes aluminum that is precipitated from the wafer-placement surface of the wafer stage 116 as well as that is precipitated from the inner wall of the processing chamber 106.

In this embodiment described above, the apparatus performs plasma processing in Step S202 under plasma processing conditions for three-dimensional memory fabrication. However, an apparatus can achieve effects similar to those in this embodiment even under plasma processing conditions for metal gate electrode processing, fin-FET fabrication and other manufacturing.

The plasma processing method shown in FIG. 2 omits an aging process that is otherwise conducted before Step S201 for wafer carrying-in. If an aging process conducted before Step S201 for wafer carrying-in involves cleaning parts inside a processing chamber 106, another embodiment that includes the aging process can prevent metallic contamination and foreign matter occurrence similarly to this embodiment even in cases where the degree of deposition, temperatures at parts inside the processing chamber 106, and other conditions are substantially different from those for product processing.

In the embodiment according to the present invention described above, the plasma processing method is applied to the VHF dry etching apparatus shown in FIG. 1. Plasma etching apparatuses using other plasma sources, such as capacitively coupled plasma, inductively coupled plasma, and electron cyclotron resonance (ECR) plasma, can produce effects similar to those in this embodiment if these apparatuses employ gas mixing ratios, gas flow rates, pressures, and treatment processes with adjusted radio frequency power for plasma generation, that are appropriate for their plasma sources. Moreover, an apparatus adopting chemical-vapor deposition (CVD) or another plasma method can reduce contamination by aluminum and other metals if a gas containing sulfur and oxygen, or a gas mixture containing sulfur or oxygen is introduced into the apparatus and plasma processing as illustrated in the flowchart of FIG. 2 or 6 is performed.

What is claimed is:

1. A plasma processing method for plasma etching a sample in a metallic processing chamber, the method comprising:
    etching the sample with a plasma;
    plasma-cleaning the metallic processing chamber using a fluorine-containing gas after etching the sample; and
    plasma-processing the metallic processing chamber using a gas mixture of a Carbonyl Sulfide (COS) gas and oxygen gas after plasma-cleaning the metallic processing chamber.

2. A plasma processing method for plasma etching a sample in a metallic processing chamber, the method comprising:
    etching the sample with a plasma;
    plasma-cleaning the metallic processing chamber using a fluorine-containing gas after etching the sample; and
    plasma-processing the metallic processing chamber using a gas mixture of a Sulfur Dioxide ($SO_2$) gas and oxygen gas after plasma-cleaning the metallic processing chamber.

3. The plasma processing method of claim 1, further comprising plasma-processing the metallic processing chamber using a gas mixture of a Carbonyl Sulfide (COS) gas and oxygen gas or a gas mixture of a Sulfur Dioxide ($SO_2$) gas and oxygen gas before etching the sample.

4. A plasma processing method for plasma-etching a sample in a metallic processing chamber, the method comprising:
    etching the sample with a plasma;
    plasma-cleaning the metallic processing chamber after etching the sample; and
    plasma-processing the metallic processing chamber using a gas mixture of a Carbonyl Sulfide (COS) gas and oxygen gas or a gas mixture of a Sulfur Dioxide ($SO_2$) pas and oxygen gas after plasma cleaning the metallic processing chamber,
    wherein said plasma-cleaning of the metallic processing chamber comprises removing a silicon-containing film using a fluorine-containing gas through plasma cleaning, removing a carbon-containing film through plasma cleaning, and removing a metal-containing film through plasma cleaning.

5. The plasma processing method of claim 2, further comprising:
    plasma-processing the metallic processing chamber using a gas mixture of a Carbonyl Sulfide (COS) gas and oxygen gas or a gas mixture of a Sulfur Dioxide ($SO_2$) gas and oxygen gas before etching the sample.

* * * * *